United States Patent
Uematsu et al.

(10) Patent No.: US 9,773,738 B2
(45) Date of Patent: Sep. 26, 2017

(54) CIRCUIT SUBSTRATE FOR SEMICONDUCTOR PACKAGE WITH MULTIPLE CIRCUIT SUBSTRATE UNITS AND SEMICONDUCTOR PACKAGE THEREFOR

(71) Applicant: HITACHI METALS, LTD., Minato-ku, Tokyo (JP)

(72) Inventors: Yutaka Uematsu, Tokyo (JP); Hiroyuki Nagatomo, Tokyo (JP); Junichi Masukawa, Tokyo (JP)

(73) Assignee: Hitachi Metals, Ltd., Tokyo (JP)

( * ) Notice: Subject to any disclaimer, the term of this patent is extended or adjusted under 35 U.S.C. 154(b) by 0 days.

(21) Appl. No.: 14/874,242

(22) Filed: Oct. 2, 2015

(65) Prior Publication Data
US 2016/0099197 A1  Apr. 7, 2016

(30) Foreign Application Priority Data

Oct. 2, 2014  (JP) ................................. 2014-204073

(51) Int. Cl.
*H01L 23/538*   (2006.01)
*H01L 23/498*   (2006.01)
*H01L 23/50*    (2006.01)

(52) U.S. Cl.
CPC .... *H01L 23/5385* (2013.01); *H01L 23/49811* (2013.01); *H01L 23/49816* (2013.01);
(Continued)

(58) Field of Classification Search
CPC ....... H01L 2924/00; H01L 2224/48227; H01L 2224/73265; H01L 27/10814; H01L 27/10894
See application file for complete search history.

(56) References Cited

U.S. PATENT DOCUMENTS

2007/0194433 A1* 8/2007 Suwa ................ H01L 23/49838
257/700
2007/0204251 A1* 8/2007 Katagiri .............. G06F 17/5068
716/122
(Continued)

FOREIGN PATENT DOCUMENTS

JP         3-190298 A     8/1991
JP      2007-318039 A    12/2007

OTHER PUBLICATIONS

Blum et al., Multichip Module Substrates, 1999, Johns Hopkins APL Technical Digest, vol. 20, No. 1, pp. 62-69.*
(Continued)

*Primary Examiner* — Marcos D Pizarro
*Assistant Examiner* — Shannon Yi
(74) *Attorney, Agent, or Firm* — Miles & Stockbridge P.C.

(57) ABSTRACT

Provided is a circuit substrate for a semiconductor package used for mounting a plurality of semiconductor devices. The circuit substrate including: a first circuit substrate unit; and a second circuit substrate unit that is formed on the first circuit substrate unit, wherein Young's modulus of a first dielectric material composing the dielectric layer of the first circuit substrate unit is higher than Young's modulus of a second dielectric material composing the dielectric layer of the second circuit substrate unit, and a coefficient of thermal expansion of the first dielectric material composing the dielectric layer of the first circuit substrate unit is smaller than a coefficient of thermal expansion of the second dielectric material composing the dielectric layer of the second circuit substrate unit.

17 Claims, 15 Drawing Sheets

(52) U.S. Cl.
CPC .......... *H01L 23/50* (2013.01); *H01L 23/5383* (2013.01); *H01L 23/5386* (2013.01); *H01L 2224/16225* (2013.01); *H01L 2924/15174* (2013.01); *H01L 2924/15192* (2013.01); *H01L 2924/15311* (2013.01)

(56) References Cited

U.S. PATENT DOCUMENTS

| 2008/0284037 | A1* | 11/2008 | Andry | H01L 21/6835 257/774 |
| 2010/0290191 | A1* | 11/2010 | Lin | H01L 23/49816 361/704 |
| 2013/0175705 | A1* | 7/2013 | Lin | H01L 25/105 257/777 |
| 2013/0270682 | A1* | 10/2013 | Hu | H01L 23/5389 257/666 |
| 2014/0035097 | A1* | 2/2014 | Lin | H01Q 21/064 257/531 |
| 2014/0264820 | A1* | 9/2014 | Hu | H01L 23/3736 257/713 |
| 2015/0028473 | A1* | 1/2015 | Kim | H01L 23/481 257/737 |
| 2015/0262904 | A1* | 9/2015 | Hung | H01L 23/367 257/713 |
| 2016/0020170 | A1* | 1/2016 | Ho | H01L 24/24 257/774 |

OTHER PUBLICATIONS

Ferro Electronic Material, A6M High Frequency, High Reliability LTCC Tape System, Feb. 2013, Ferro Electronic Material, pp. 1-2.*
Shick et al., Avatrel Dielectric Polymers for Electronic Packaging, 1998, Advancing Microelectronics, pp. 1-6.*
Cheung, Micro-Electro-Mechanical Systems (MEMS) Fabrication, Dec. 28, 2013, U.C. Berkeley, Slides 1-42.*
Nagashima et al., Cellulose Nanofiber Paper as an Ultra Flexible Nonvolatile Memory, Jul. 2, 2014, Scientific Reports, pp. 1-7.*
Cornell University, iNEMISubstrateFlex0808, Jun. 16, 2014, pp. 1-19.*

* cited by examiner

F I G . 1
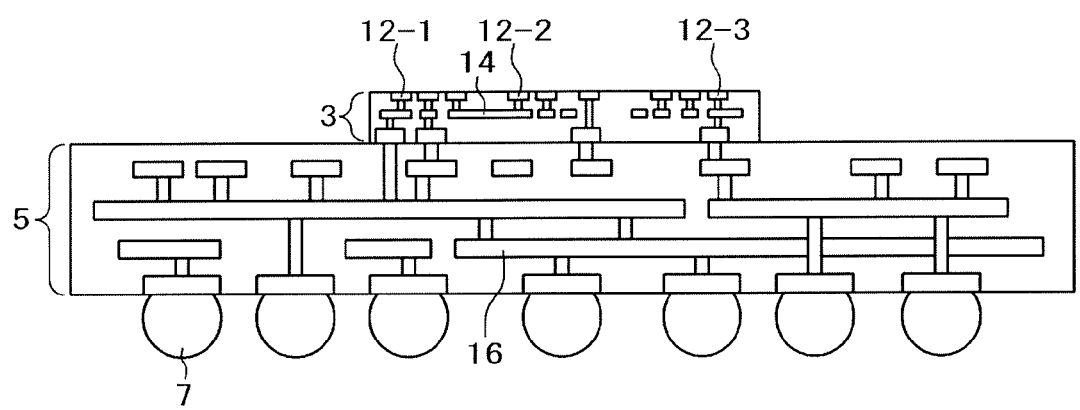

F I G . 8
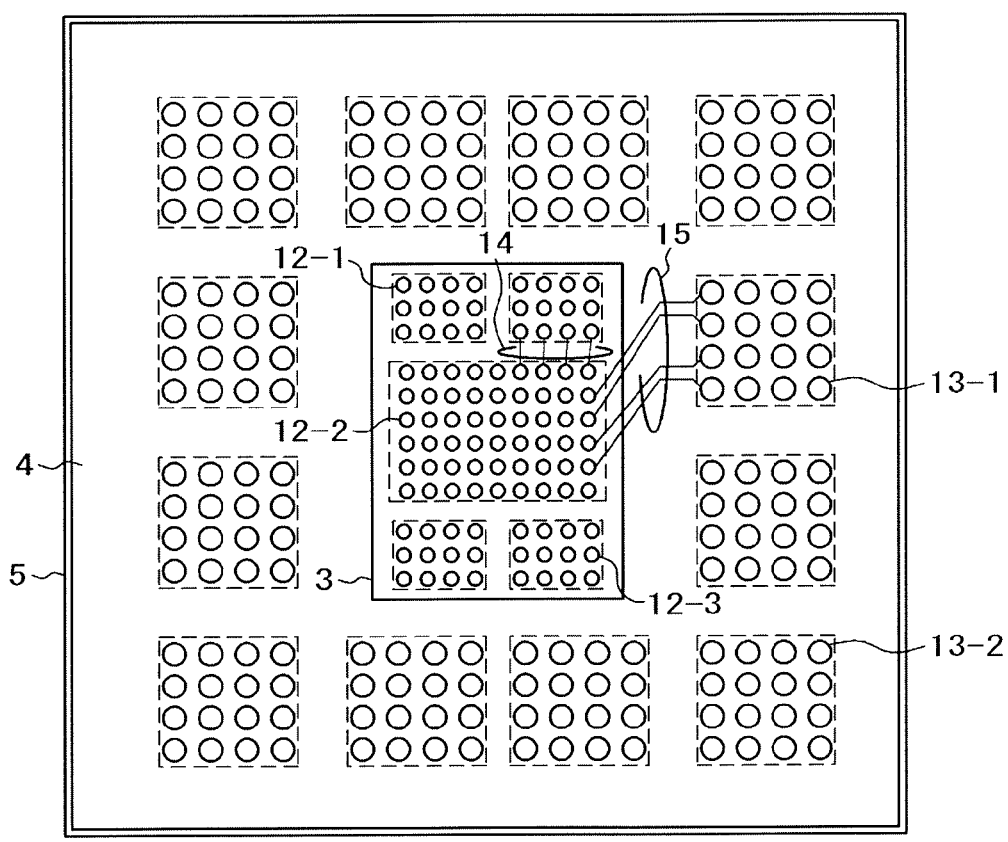

F I G . 1 1
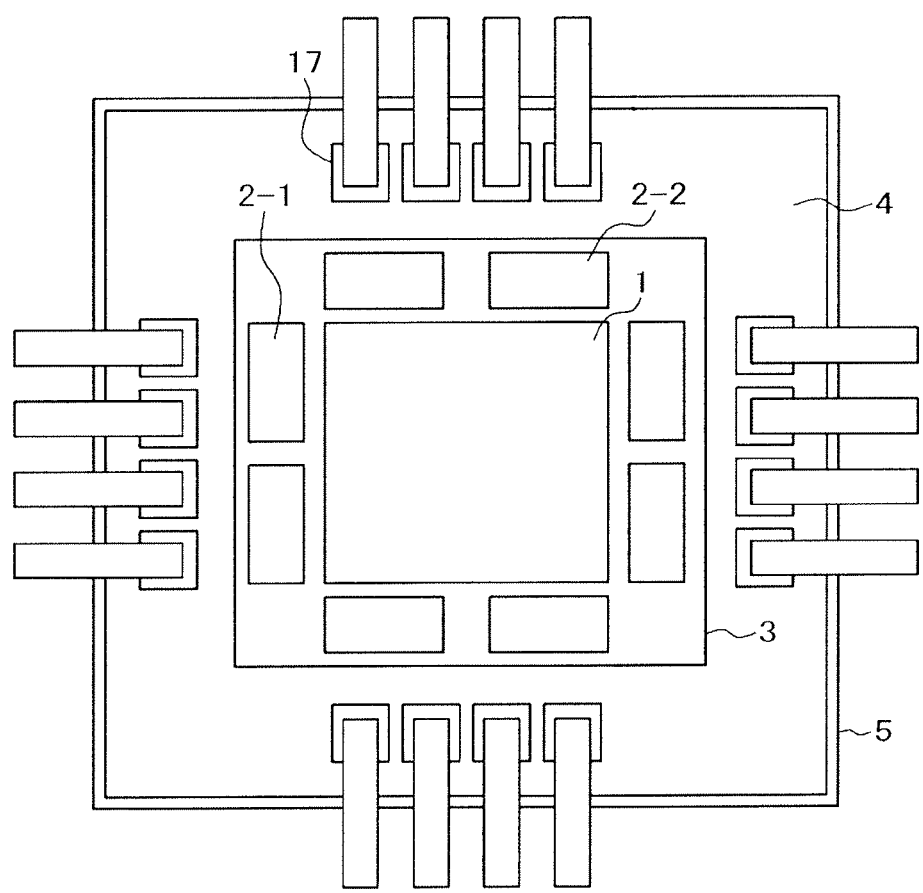

FIG.15
(a)
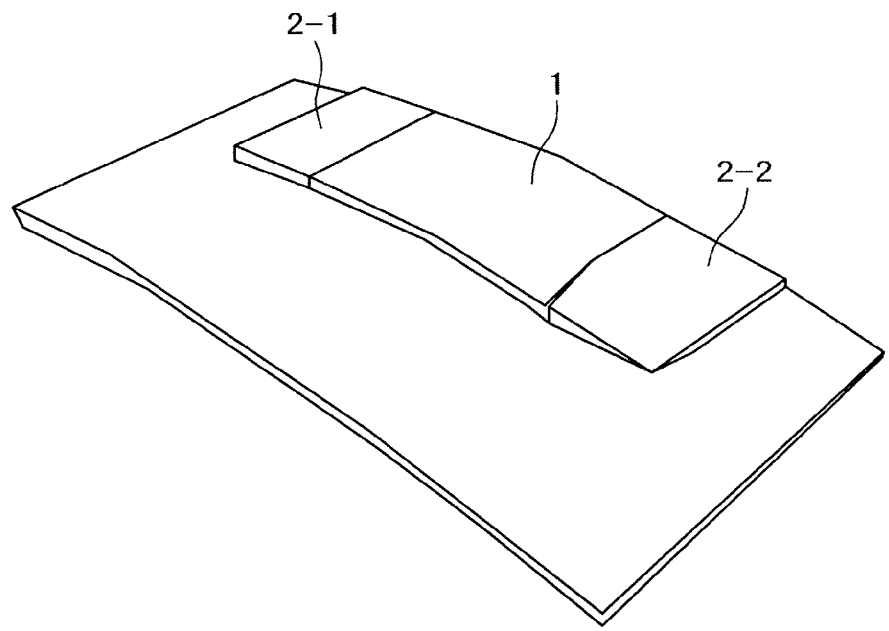
(b)
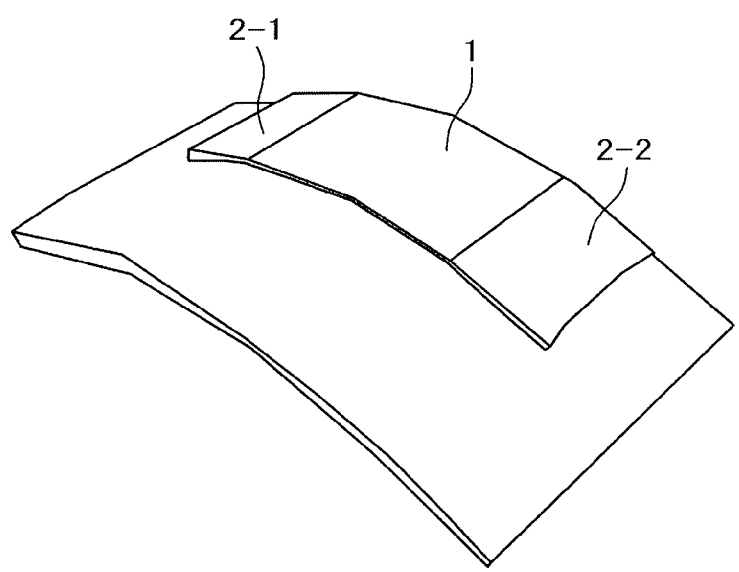

FIG.16
(a)
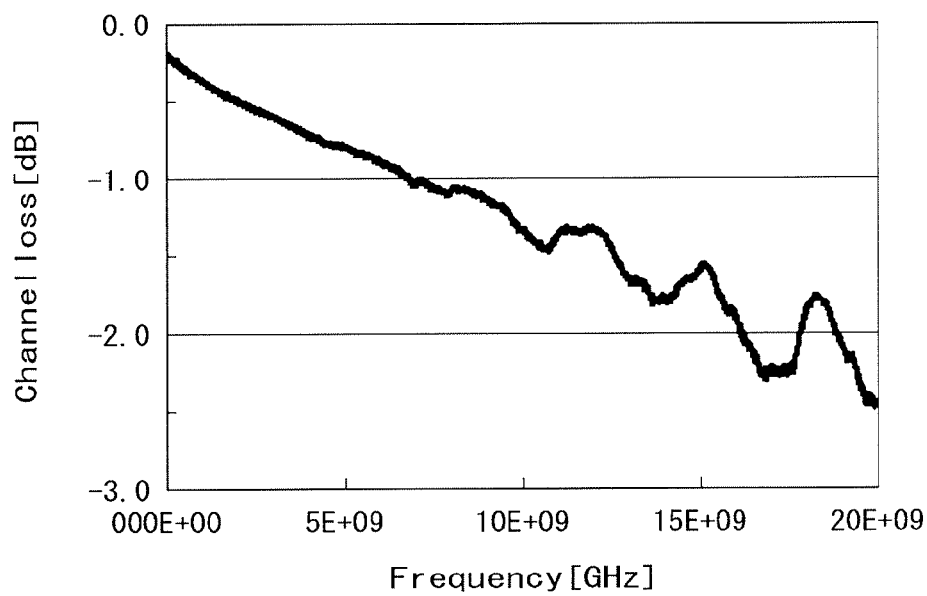
(b)
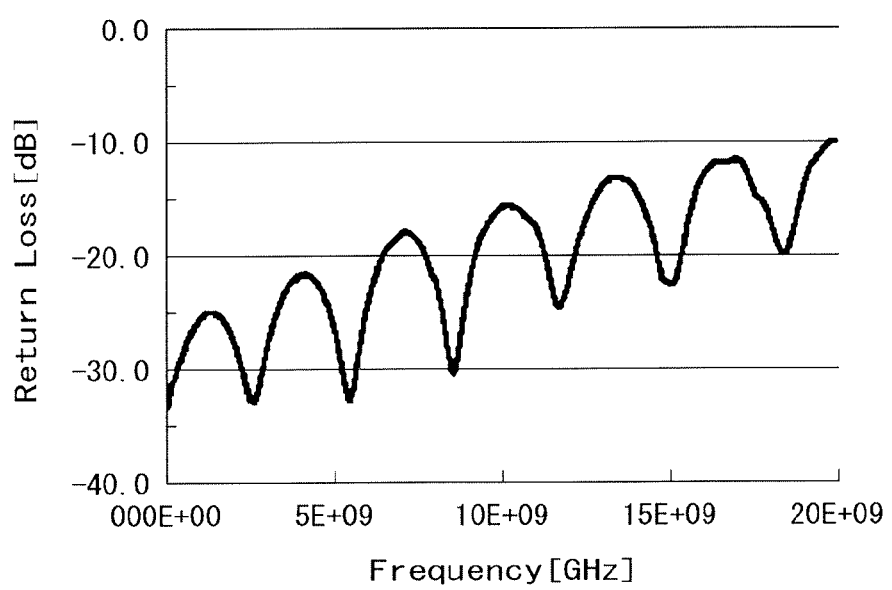

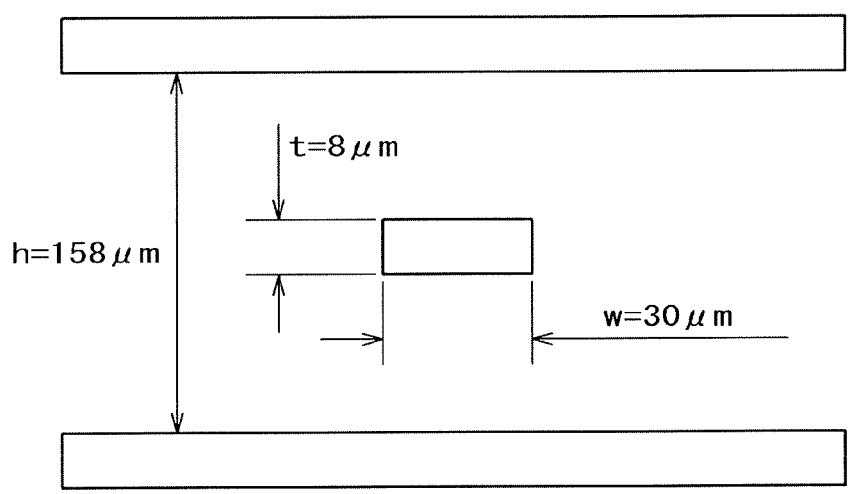
F I G . 1 7

CIRCUIT SUBSTRATE FOR SEMICONDUCTOR PACKAGE WITH MULTIPLE CIRCUIT SUBSTRATE UNITS AND SEMICONDUCTOR PACKAGE THEREFOR

CLAIM OF PRIORITY

The present application claims priority from Japanese patent application JP2014-204073 filed on Oct. 2, 2014, the content of which is hereby incorporated by reference into this application.

BACKGROUND OF THE INVENTION

1. Field of the Invention

The present invention relates to a semiconductor package used for an information apparatus and the like and, for example, is applicable to a semiconductor package in which a processor, a photoelectric conversion integrated circuit (IC), and a broadband memory are mounted in a same package.

2. Description of the Related Art

As background art, there is a high bandwidth memory (HBM) that is one of memories that have been standardized by a dynamic random access memory (DRAM) standardization organization. In order to increase a transmission density between processor and memories, such a memory requires 1,000 or more data units per chip, and thus, an ultra-high density line technology (for example, 2.5 D packaging to which a silicon interposer is applied) with fine lines having a width of about 2 to 3 μm is necessary. Such a packaging technology is applicable also to a connection between a processor and an optical IC in an apparatus requiring a high throughput such as a high performance computer (HPC), a server, or a communication apparatus in addition to the improvement of the transmission density between memories.

SUMMARY OF THE INVENTION

In a circuit substrate for a semiconductor package, in which an HBM described in related art is mounted, according to a request for securing a ball grid array (BGA) mounting area used for electric multi-point (1,000 or more pins) connections with a mainboard or mounting a photoelectric conversion IC and the like within the same package, a large package of which the size of one longer side of the mounting area is about 50 mm to 60 mm is necessary. For the formation of a fine line having a width of about 2 to 3 μm, while a high-resolution exposure machine (stepper) is used, there is a restriction (the size of one longer side is about 20 mm to 30 mm) on the exposing size, and thus, there is a problem in that a high-density line section cannot be configured to be large (the size of one longer side of about 50 mm to 60 mm).

As a solving means for this, as disclosed in Japanese Unexamined Patent Application Publication No. H03-190298, there is a method in which a high-density line section of an organic package is formed in an upwardly protruding shape on a large organic substrate having a line density lower than the high-density line section. However, such a method has the following problems for an application to a circuit substrate for a semiconductor package.

(1) In an organic package, as a dielectric material used for forming a fine line having a width of about 2 to 3 μm as a conductive layer, a thin dielectric material having a thickness of about several μm is used in consideration of fine line processability. Generally, Young's modulus of the thin dielectric material having the thickness of about several μm is low to be less than 10 GPa. For this reason, as disclosed in Japanese Unexamined Patent Application Publication No. H03-190298, even when a high-density line and a low-density line are configured as a conductive layer in a stepped manner by using the same dielectric material, Young's modulus of the whole package is low, and, when a package of which the size of one longer side is about 50 mm is configured, the strength is not maintained. For this reason, there are problems of no securement of a BGA mounting area used for a connection with a mainboard and the like.

(2) In the organic package, generally, the coefficient of thermal expansion (CTE) of the thin dielectric material having the thickness of about several μm used for forming the fine line having a width of about 2 to 3 μm as a conductive layer exceeds 20 ppm/K (commonly, about 30 to 50) and is extremely larger than 2.3 to 3 ppm/K of silicon composing a semiconductor device. For this reason, in a case where a package is configured by using a dielectric material as in Japanese Unexamined Patent Application Publication No. H03-190298, the CTE of the package is quite larger than that of silicon. Accordingly, the distance of the connection interface is not uniform due to a difference between the amounts of warpage according to a difference between the CTEs, and, on a face of which the size of one longer side is 10 mm or more, a connection cannot be made at a narrow bump pitch of several tens of μm.

Thus, according to the invention disclosed in Japanese Unexamined Patent Application Publication No. H03-190298, the securement of mechanical strength of a large circuit substrate for a semiconductor package of which the size of one longer side is a little more than 50 mm and a connection of a narrow bump pitch of about several tens μm are not made, and a desired semiconductor package structure having a line having a width of about 2 to 3 μm cannot be realized.

An object of the present invention is to provide a large semiconductor package enabling a high-density line.

While the present invention includes a plurality of means for achieving the above-described object, as an example of a circuit substrate for a semiconductor package according to the present invention, there is provided a circuit substrate for a semiconductor package used for mounting a plurality of semiconductor devices. The circuit substrate includes: a first circuit substrate unit that has a stacked structure of a dielectric layer and a conductor layer; and a second circuit substrate unit that is formed on the first circuit substrate unit and has a stacked structure of a dielectric layer and a conductor layer, wherein Young's modulus of a first dielectric material composing the dielectric layer of the first circuit substrate unit is higher than Young's modulus of a second dielectric material composing the dielectric layer of the second circuit substrate unit, a coefficient of thermal expansion of the first dielectric material composing the dielectric layer of the first circuit substrate unit is smaller than a coefficient of thermal expansion of the second dielectric material composing the dielectric layer of the second circuit substrate unit, the first circuit substrate unit has an area of a circuit formation face larger than that of the second circuit substrate unit, a plurality of electrodes used for mounting a semiconductor device are included on a surface of the second circuit substrate unit, and a minimum line width of an electrical line embedded in the second circuit substrate unit is smaller than a minimum line width of an electrical line embedded in the first circuit substrate unit.

The other configurations and advantages of the present invention will become more apparent through disclosure of the entire descriptions presented below.

According to the present invention, by forming a second circuit substrate unit used for a high-density fine line that enables a line having a width of about 2 to 3 μm on a first circuit substrate unit having high Young's modulus and a low coefficient of thermal expansion, a high-density line can be made with the strength being maintained, and accordingly, a large semiconductor package can be provided.

BRIEF DESCRIPTION OF THE DRAWINGS

FIG. 1 is a cross-sectional view of a circuit substrate for a semiconductor package according to a first embodiment;

FIG. 8 is a top view of the circuit substrate for a semiconductor package according to the fourth embodiment;

FIG. 11 is a top view of the semiconductor package according to the fifth embodiment;

FIG. 15 illustrates a comparison result of a warped state according to the stress analysis;

FIG. 16 illustrates measurement results of an insertion loss and a reflection loss of a trial LTCC substrate; and FIG. 17 is a line cross-sectional view of a trial LTCC substrate.

DETAILED DESCRIPTION OF THE INVENTION

Figure 2:
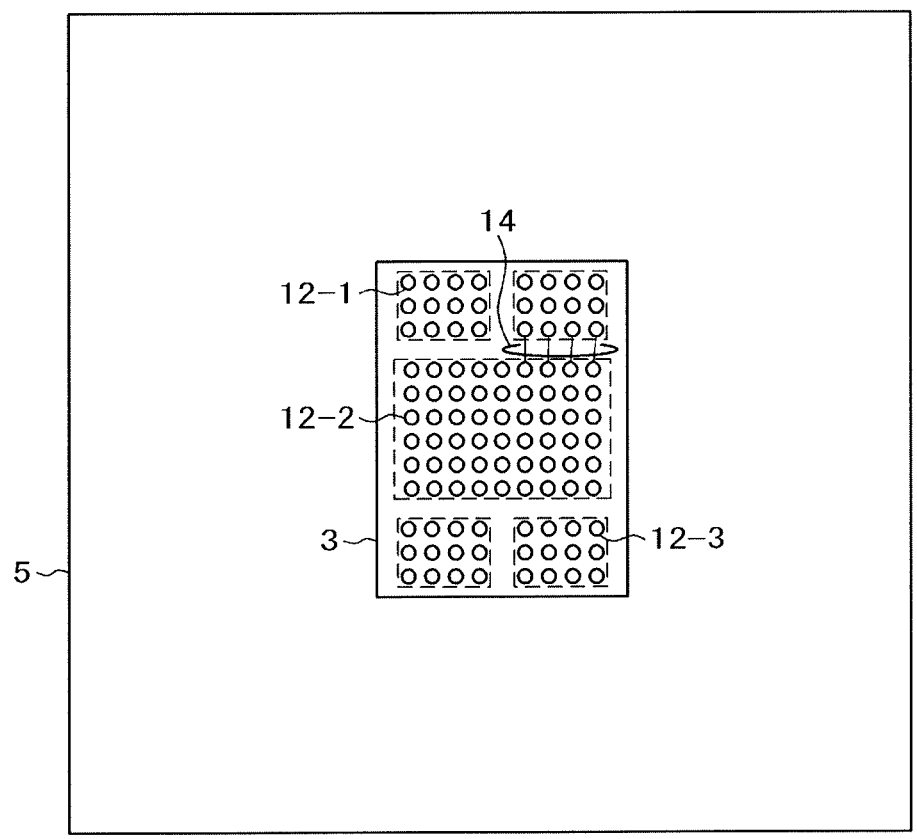
FIG. 2 is a top view of the circuit substrate for a semiconductor package according to the first embodiment.

Hereinafter, embodiments of the present invention will be described with reference to the drawings. In the drawings used for describing the embodiments, the same name and reference numeral are assigned to the same constituent element, and the description thereof will not be repeated.

First Embodiment

A cross-sectional view of a circuit substrate for a semiconductor package according to a first embodiment of the present invention is illustrated in FIG. 1, and a top view thereof is illustrated in FIG. 2.

In the configuration illustrated in FIG. 1, in a first circuit substrate unit 5 of a lowermost layer, a plurality of solder balls (BGA balls) 7 are arranged on a lower face as terminals for connections with a mainboard used for forming electrical connections with the mainboard, and lines 16 are built on the inside of the first circuit substrate unit 5 and electrically connect the BGA balls and lines 14 of a second circuit substrate to each other. In addition, a mounted semiconductor device such as a large scale integration (LSI) is electrically connected to semiconductor device mounting electrodes 12-1 to 12-3 disposed on the surface of the second circuit substrate electrically connected to the lines 14. This circuit substrate unit includes: a dielectric layer that is defined as a layer acquired by forming a dielectric material in a substrate shape having a plane serving as a circuit formation face; and a conductor layer that is defined as an electric line formed on the circuit formation face of the dielectric layer. The dielectric layer and the conductor layer form a stacked structure. In the first circuit substrate unit 5, an appearance is illustrated in which the dielectric layer is formed between a plurality of lines 16 illustrated to horizontally spread. It is preferable that the dielectric layer have a substrate shape having a parallel face that is the same shape as that of the circuit formation face so as to form the stacked structure. In addition, a via electrode and the like may be included in the dielectric layer so as to be electrically connected to the conductor layer of the circuit formation face when the stacked structure is formed. As the first circuit substrate unit, a low temperature co-fired ceramics (LTCC) circuit substrate (for example, low temperature co-fired ceramics disclosed in Japanese Unexamined Patent Application Publication No. 2007-318039; Young's modulus: 110 GPa; CTE: about 3 to 12) may be used. Alternatively, as the first circuit substrate unit, a core material-inserted organic package may be used. The core material-inserted organic package, for example, includes a core material formed from an organic material and buildup lines that are disposed up and down with respect to the core material as the center as a conductive layer. In addition, the BGA balls may be configured by a land grid array (LGA). Furthermore, on the first circuit substrate unit, on a side facing the face on which the BGA balls are arranged, a second circuit substrate unit 3 formed by stacking an organic thin-film dielectric material and a conductive material such as copper is formed. In this second circuit substrate unit, lines 14 having a minimum line width smaller than that of the lines embedded in the first circuit substrate unit, for example, having a minimum line width of ½ or less of that of the lines embedded in the first circuit substrate unit and having a high density are arranged, and such hierarchization of the minimum lines is one of characteristics. In this way, by configuring the minimum line width of the conductive layer of the second circuit substrate unit to be smaller than the minimum line width of the conductive layer of the first circuit substrate unit, for example, in a case where the entirety of the semiconductor device, the second circuit substrate unit, the first circuit substrate unit, and the mainboard is considered as one circuit, the configuration may be considered as increasing the line width in the order described above. In the former case, the number of lines is large, and the line width decreases for the arrangement at a high density, and the line is shortened for decreasing the resistance. Similarly, in the latter case, the number of lines is small, and the line width is configured to be large for decreasing the resistance. Accordingly, both effects of a high density line and low resistance can be acquired, which is preferable. Here, the size of a portion of which the size in a direction that is vertical to the current direction of electric lines formed in the conductor layer and is parallel to the circuit formation face is the smallest is defined as the minimum line width. In addition, the area of the circuit formation face of the second circuit substrate unit is smaller than that of the first circuit substrate unit, which is also a structural characteristic. In this way, by configuring the area of the circuit formation face of the first circuit substrate unit to be larger than that of the second circuit substrate unit, for example, the area of the second circuit substrate unit used for mounting the semiconductor device can be decreased, and, for example, in the first circuit substrate unit used for a connection to an organic package substrate or the like, the pitch of bumps arranged as electrodes is large, and the area of the circuit formation face can be formed to be large, which is preferable. In the second circuit substrate unit 3, an appearance is illustrated in which the dielectric layer is formed between layers of a plurality of lines 14 illustrated to spread horizontally.

In addition, there is a big difference from that disclosed in Japanese Unexamined Patent Application Publication No. H03-190298 that the material constants of a first dielectric material composing the first circuit substrate unit and a second dielectric material composing the second circuit substrate unit are different from each other. These differences and advantages thereof about the minimum line widths and the dielectric materials will be described. Table 1 illustrates relations among Young's modulus of the dielectric layer, the coefficient of thermal expansion (CTE), the material constant of the dielectric constant, the minimum line width, the line area, and the use of each circuit substrate unit according to the first embodiment.

TABLE 1

|  | First circuit substrate unit | Second circuit substrate unit |
|---|---|---|
| Young's modulus [GPa] | about 100 | less than 10 (about 3) |
| CTE [ppm/K] | about 3 to 10 | about 20 to 50 |
| Dielectric constant | about 4 to 12 | about 3 to 5 |
| Minimum line width | about 15 to 30 μm | about 0.5 to 3 μm |
| Line area | 50 mm square or more | about 30 mm square |
| Use | mainboard connection line, structure support, matching coefficient of thermal expansion (improvement of fine pitch connectability) | broadband memory line |

Figure 3:
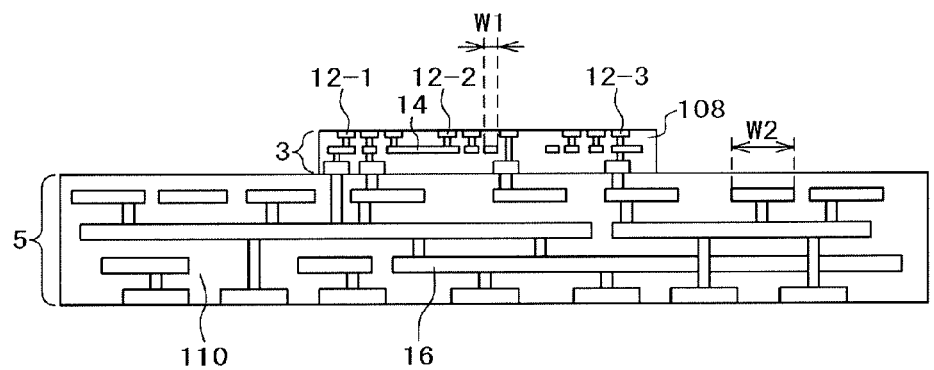
FIG. 3 is a comparative diagram of a first circuit substrate unit and a second circuit substrate unit according to the first embodiment.

The characteristics of the first circuit substrate unit and the second circuit substrate unit described above will be arranged with reference to FIG. 3.

The miniaturization of semiconductor devices has advanced every year, and the miniaturization of terminal intervals between external connection terminals of a semiconductor device also advances in accordance therewith. In order to connect a semiconductor device having a plurality of external connection terminals of about several tens of μm or less in an upper part of the second circuit substrate unit 3, it is necessary to reduce the influence of warpage by decreasing a difference in the coefficient of thermal expansion from silicon. Meanwhile, the coefficient of thermal expansion of the second circuit substrate unit 3 is about 20 to 50 as represented in Table 1 and is greatly different from that of silicon, and it is difficult to implement a connection on a large area due to warpage according thereto, and there is a problem in that only a connection face of which the size of one longer side is 10 mm or less can be formed per semiconductor device. In order to solve this problem, the dielectric material of the first circuit substrate unit 5 of which Young's modulus is large to be 80 to 200 GPa and the coefficient of thermal expansion is small to be 3 to 10 ppm/K is selected. By configuring the Young's modulus of the first dielectric material forming the dielectric layer 110 of the first circuit substrate unit to be 80 GPa or more and 200 GPa or less, the mismatch between coefficient of thermal expansion of the second circuit substrate unit and, for example, the semiconductor device, the mainboard, or the like can be relieved, which is preferable. In addition, by configuring the coefficient of thermal expansion of the first dielectric material forming the dielectric layer 110 of the first circuit substrate unit to be 3 ppm/K or more and 10 ppm/K or less, even in a case where a difference between the coefficient of thermal expansion of the semiconductor device and the second circuit substrate unit is large, the warpage of the semiconductor device and the first circuit substrate unit can be suppressed, which is preferable. As an example, the numerical values of a case where LTCC of which main compositions are $Al_2O_3$, $SiO_2$, and SrO is used as the material of the first circuit substrate unit, and a material of which the main composition is a cycloolefin polymer is used as the material of the second circuit substrate unit are represented in Table 1. As a result, a circuit substrate for a semiconductor package of which the size of one longer side exceeds 50 mm is realized, and a connection area for a semiconductor device can exceed about 400 $mm^2$ per semiconductor device. In addition, the line width (W2 in the figure) of the first circuit substrate unit 5 is thicker than the line width W1 of the second circuit substrate unit 3 that is about 2 to 3 μm and has a minimum value of about 15 to 30 μm. As configuring as such, for example, the mismatch between the coefficient of thermal expansion of the semiconductor device, the second circuit substrate unit, and the mainboard is relieved by the first circuit substrate unit having a high Young's modulus, and, even in a case where a difference between the coefficient of thermal expansion of the semiconductor device and the second circuit substrate unit is large, a result that the warpage of the semiconductor device and the first circuit substrate unit is suppressed can be acquired.

A method of measuring the material constants represented in Table 1 is as follows.

Dielectric constant: A dielectric constant characteristic is acquired by using a network analyzer using a method that uses a cylindrical resonator (compliant with JIS R1627).

CTE: The evaluation of the CTE (coefficient of thermal expansion) is made using a method that is compliant with JIS R1618. By using a thermomechanical analysis (TMA) apparatus, an average coefficient of thermal expansion of room temperature (RT) to 400° C. is evaluated.

Young's modulus: The evaluation of Young's modulus is made using an ultrasonic pulse described in JIS R1602.

For example, in the case of the LTCC of which main compositions are $Al_2O_3$, $SiO_2$, and SrO, the CTE at the time of raising the temperature from a room temperature to 180° is 6 ppm/K, and Young's modulus at that time is 110 GPa. In addition, in a case where a material of which the main composition is a cycloolefin polymer is used as a thin dielectric layer of about several μm under the same condition, the CTE is 50 ppm/K, and Young's modulus at that time is 2.9 GPa.

A result of a quantitative comparison between this embodiment and a conventional technology is as follows.

In Japanese Unexamined Patent Application Publication No. H03-190298, based on the mechanical strength and the warpage according to a CTE mismatch with silicon, the package size has a limit of about 10 mm in the size of one longer side. In addition, it is difficult for the connection terminal interval of a semiconductor device to respond to several tens of μm, and, practically, the connection terminal interval is a little more than 100 μm. Thus, the package cannot be used for a high bandwidth memory (HBM) that is a next-generation high performance memory, which has been standardized by JEDEC, requiring to respond to a connection at a terminal interval of 55 μm.

In contrast to this, in this embodiment, by configuring the first circuit substrate unit having high Young's modulus and a low coefficient of thermal expansion (CTE) as the base, a size difference according to thermal expansion can be decreased, and the strength can be increased. Accordingly, the warpage of the semiconductor device and the first circuit substrate unit is suppressed, and a size of the package of which one longer side exceeds 50 mm can be realized. In addition, by configuring the coefficient of thermal expansion of the first dielectric material composing the dielectric layer of the first circuit substrate unit and the second dielectric material composing the dielectric layer of the second circuit substrate unit to be almost the same, a connection at a terminal interval of 55 μm can be responded, and this embodiment can be applied to the HBM.

According to this embodiment, by employing the configuration of the circuit substrate for a semiconductor package in which the second circuit substrate unit (for example, an organic material of Young's modulus: less than 10 GPa and CTE: about 20 to 50 ppm/K) focusing on the miniaturization of lines is stacked on the first circuit substrate unit (for example, an LTCC material of Young's modulus: about 80 to 200 GPa and CTE: about 3 to 12 ppm/K) configured using a dielectric material that has high Young's modulus for maintaining the strength of the entire structure and has a low CTE that is close to the coefficient of thermal expansion (CTE) of the silicon material of the semiconductor device, a desired connection area and a desired line density of the circuit substrate for a package can be realized. By configuring the Young's modulus of the second dielectric material composing the dielectric layer of the second circuit substrate unit to be less than 10 GPa and the coefficient of thermal expansion to be 20 ppm/K or more and 50 ppm/K or less, a resin material can be selected from among resin materials that can be easily acquired actually, which is preferable. By using a circuit substrate acquired by stacking the first and second circuit substrate units, for example, the mismatch between the coefficient of thermal expansion of the semiconductor device, the second circuit substrate unit, and the mainboard is relieved by the first circuit substrate unit having a high Young's modulus, and, even in a case where a difference between the coefficient of thermal expansion of the semiconductor device and the second circuit substrate unit is large, an effect that the warpage of the semiconductor device and the first circuit substrate unit is suppressed can be acquired.

Here, the second circuit substrate unit is not limited to a rectangular shape but may have a changed shape such as a circular shape or an oval shape.

To sum up the description presented above, this embodiment discloses: a circuit substrate for a semiconductor package used for mounting a plurality of semiconductor devices. The circuit substrate includes: a first circuit substrate unit that has a stacked structure of a dielectric layer and a conductor layer; and a second circuit substrate unit that is formed on the first circuit substrate unit and has a stacked structure of a dielectric layer and a conductor layer, wherein Young's modulus of a first dielectric material composing the dielectric layer of the first circuit substrate unit is higher than Young's modulus of a second dielectric material composing the dielectric layer of the second circuit substrate unit, a coefficient of thermal expansion of the first dielectric material composing the dielectric layer of the first circuit substrate unit is smaller than a coefficient of thermal expansion of the second dielectric material composing the dielectric layer of the second circuit substrate unit, the first circuit substrate unit has an area of a circuit formation face larger than that of the second circuit substrate unit, a plurality of electrodes used for mounting a semiconductor device are included on a surface of the second circuit substrate unit, and a minimum line width of an electrical line embedded in the second circuit substrate unit is smaller than a minimum line width of an electrical line embedded in the first circuit substrate unit.

Second Embodiment

Figure 4:
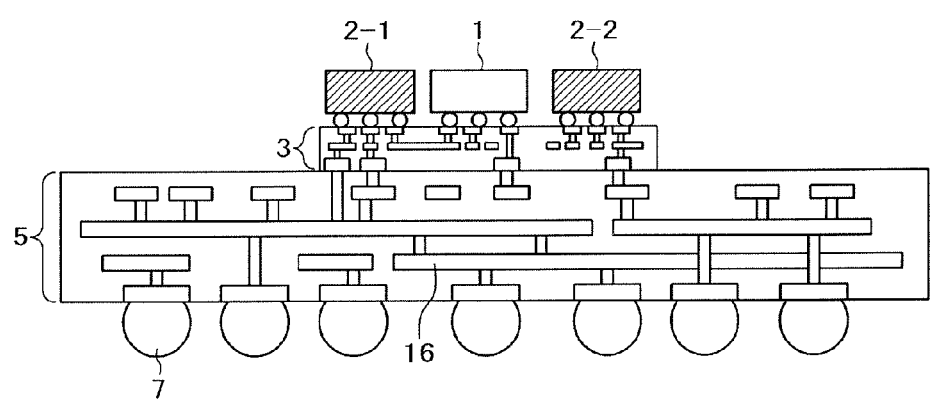
FIG. 4 is a cross-sectional view of a semiconductor package according to a second embodiment.
Figure 5:
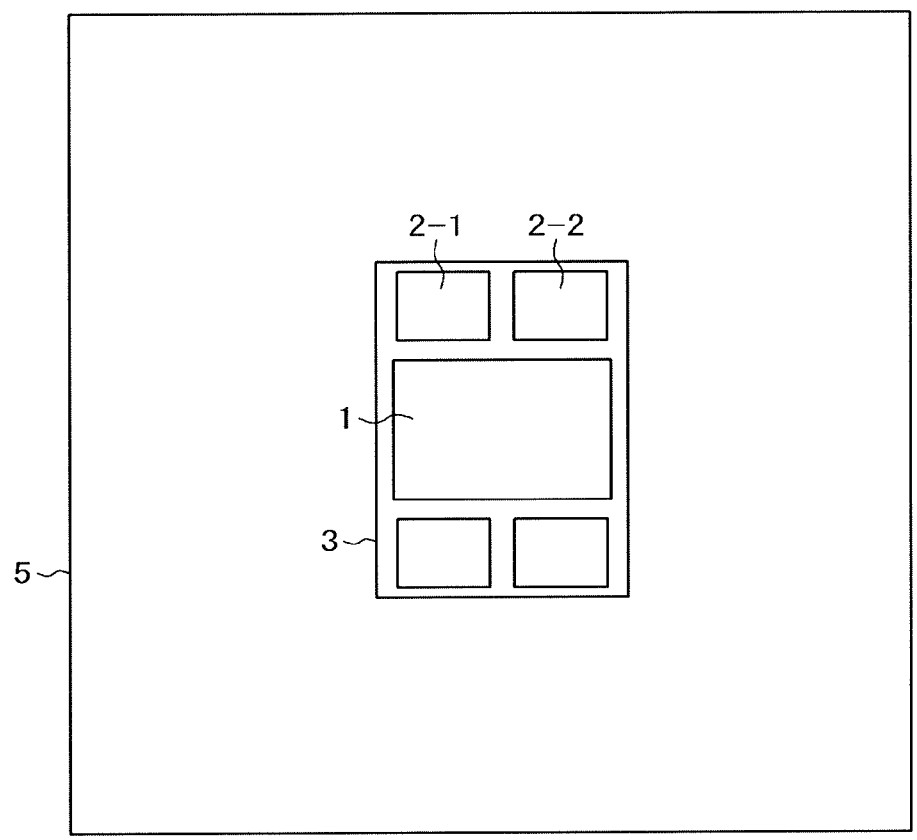
FIG. 5 is a top view of the semiconductor package according to the second embodiment.

A cross-sectional view of a semiconductor package according to a second embodiment of the present invention is illustrated in FIG. 4, and a top view thereof is illustrated in FIG. 5. In the second embodiment, a semiconductor device is mounted on the circuit substrate for a semiconductor package according to the first embodiment.

As illustrated in the figure, on a second circuit substrate unit 3, devices 2-1 and 2-2 having high-density lines and an application specific integrated circuit (ASIC) 1 are mounted.

In this description, while an example is illustrated in which a broadband memory requiring high-density lines, for example, having a width of about 2 to 3 μm or the like such as an ASIC or a HBM is mounted in the same package, any combination may be employed as long as a semiconductor device requiring high-density lines is mounted. For example, a product in which a central processing unit (CPU) and a field programmable gate array (FPGA) are mixed may be used.

Hereinafter, simulation results of a structure corresponding to a second embodiment and a structure using a Si interposer as a comparative example will be described. FIGS. 4 and 5 illustrate a top view and a cross-sectional view of a substrate acquired by arranging a fine line layer of 35 mm×mm, an ASIC of 20 mm×20 mm, and four HBMs on the periphery thereof on a substrate of 50 mm×50 mm.

Figure 14:
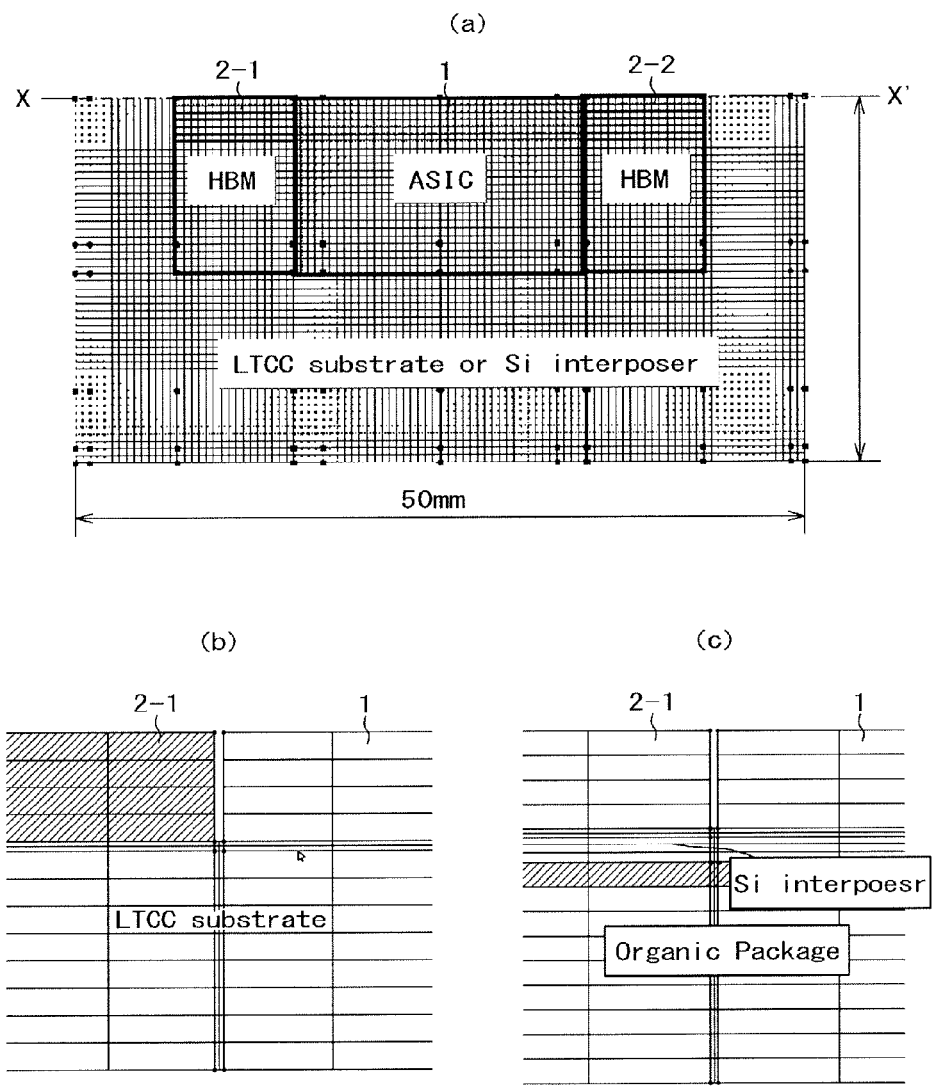
FIG. 14 is a diagram of a structure at the time of executing a stress analysis according to FEM.

FIG. 14(a) illustrates a half model according to an FEM analysis model, FIG. 14(b) is a cross-sectional view of a second embodiment using an LTCC substrate, and FIG. 14(c) is a cross-sectional view of a comparative example using a Si interposer. As the physical property values used for each configuration, numerical values illustrated in Table 2 are used. In addition, while a numerical value of "17" is inserted into the place of the CTE of the second circuit substrate unit which is written inside parentheses, it is the value of Cu. The second circuit substrate unit is in a state in which a fine line formed from Cu and polyimide are mixed. Since the CTE of polyimide is in the range of 30 to 50, effectively, the CTE of the second circuit substrate unit is in the range of 20 to 50 that are middle values thereof. In the analysis executed here, as the numerical value, the value of Cu is representatively illustrated.

TABLE 2

Physical Property Values Used in Simulation

| | | Material | Young's Modulus [GPa] | Poisson's Ratio | CTE(Coefficient of thermal expansion) [ppm/K] |
|---|---|---|---|---|---|
| Embodiment | HBM/ASIC | Si | 131 | 0.28 | 3.0 |
| | | UF(Underfill) @µ bump | 8.0/0.3 | 0.2 | 31/120 |
| | Second Circuit Substrate Unit (Fine Line Layer (Cu + polyimide)) Minimal Line Width: 2 µm | fine line layer | 20 | 0.3 | (17) |
| | First Circuit Substrate Unit (LTCC substrate): Minimal Line Width: 30 µm | LTCC | 110 | 0.2 | 6 |
| Comparative Example | HBM/ASIC | Si | 131 | 0.28 | 3.0 |
| | | UF(Underfill) @µ bump | 8.0/0.3 | 0.2 | 31/120 |
| | Si Interposer | Si | 131 | 0.28 | 3.0 |
| | | UF @C4 bump | 7.0/0.25 | 0.2 | 32/110 |
| | Organic Substrate | Organic sub. | 25 | 0.16 | 16 |

FIG. 15 illustrates a simulation result of the warped state according to the FEM. Here, simulator is analysis software called FEX produced by Hitachi. FIG. 15(a) is a second embodiment using the LTCC, and FIG. 15(b) is a comparative example using a Si interposer. The warped state of a case where a change is made from 25° C. to 180° C. is ⅕ of that of the comparative example. Accordingly, it is understood that a package circuit substrate that has a high-density fine line and cannot be easily warped can be acquired.

FIG. 16 illustrates a measurement result of a loss according to the second embodiment. FIG. 16(a) is a transmission loss, and FIG. 16(b) illustrates the characteristics of a reflection loss. Such data was evaluated by applying probes to electrodes disposed at both ends of the line by using a network analyzer. In addition, for this measurement, E8362B produced by Keysight Co. was used as the network analyzer used for high-frequency measurement. The frequency characteristics were checked by using the physical property values of the LTCC according to the second embodiment represented in Table 3 and, as the structure of the internal line, similar to that illustrated in FIG. 17, arranging the internal line to have a width of 8 µm, a width of 30 µm, and a length of 15 mm between conductors having a length of 158 µm (in the longitudinal direction in FIG. 17).

As disclosed in FIG. 16(a), it represents a low transmission loss of −1.7 dB at 14 GHz, and it represents that a signal of 28 Gbps can be passed without any problem. In addition, the reflection loss illustrated in FIG. 16(b) represents a reflection loss of −10 dB or less up to 20 GHz, and it represents that impedance control can be realized up to a high frequency.

TABLE 3

| Substrate Material | Dielectric Constant | Loss Tangent | Resistance of Conductor [µΩ-cm] |
|---|---|---|---|
| LTCC | 8.13 | 0.00086 | 2.1 (Ag) |

Accordingly, it can be known that, by using the LTCC substrate, a package circuit substrate having a low loss that is appropriate for high-speed transmission is acquired.

Third Embodiment

Figure 6:
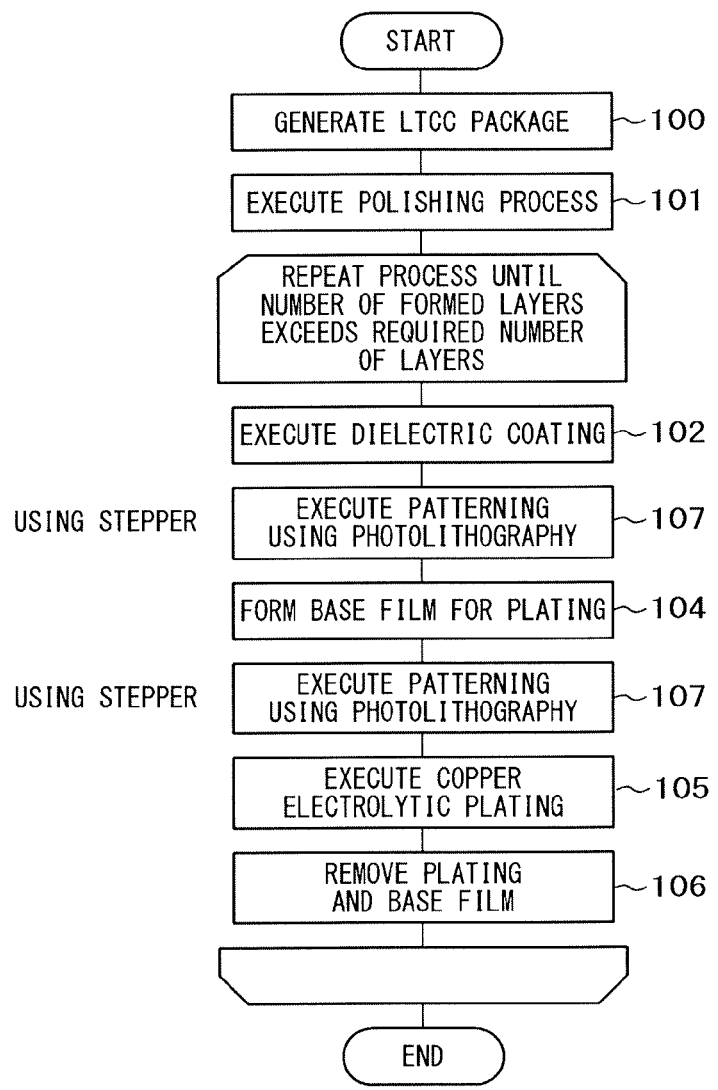
FIG. 6 is a flowchart of the process of manufacturing the circuit substrate for a semiconductor package according to the first embodiment as a third embodiment.

FIG. 6 is a flowchart of the process of manufacturing the circuit substrate for a semiconductor package according to the first embodiment as a third embodiment.

First, an LTCC package substrate unit (first circuit substrate unit) is manufactured through a general LTCC package substrate unit manufacturing process 100 in which powders of ceramics that can be co-fired with an electrode material are molded, lines are formed using the electrode material, and those are co-fired so as to manufacture an LSI package substrate. Thereafter, in order to form a fine line circuit substrate unit (second circuit substrate unit), a polishing process 101 is introduced for flattening unevenness or warpage generated in the package manufacturing process. For example, conventionally, while the coefficient of thermal expansion of the second circuit substrate unit on which a semiconductor device is mounted deviates from the coefficient of thermal expansion of the semiconductor device and thus can be easily warped, by using the LTCC as the first dielectric material composing the dielectric layer of the first circuit substrate unit, according to the configuration of the coefficient of thermal expansion and the Young's modulus of the present invention, an effect of suppressing the warpage can be acquired, which is preferable. In a case where a material, for example, having $Al_2O_3$, $SiO_2$, and SrO as its main compositions is selected as the LTCC, the Young's modulus and the coefficient of thermal expansion match those of the second circuit substrate unit and the mainboard, which is preferable.

Next, the following process for forming the second circuit substrate unit is executed. In other words, until the formation of a conductive layer is completed, a dielectric coating process 102, a patterning process 107 through photolithography by using a stepper, a base film forming process 104 for plating, the patterning process 107 through photolithography by using the stepper, a copper electrolytic plating process 105, and a plating and base film eliminating process 106 are repeated. In the dielectric coating process 102, in order to connect upper and lower lines 14, holes may be disposed through a patterning process or the like. In addition, the patterning process 107 includes the process of coating, exposing, and developing a resist. By using an organic material as the second dielectric material composing the dielectric layer of the second circuit substrate unit, there is an advantage in terms of the processing cost. While the equipment cost and the processing cost are required in a case where an inorganic film is formed as a thin film acquired through the CVD or the like, in the case of an organic material, a film can be formed using a simple means such as spin coat or the like. In addition, in the case of a thin film, since a form on which a level difference of the first circuit substrate unit of the base is reflected is formed, the surface can be formed to be uneven. For this reason, in order to form a fine line thereon, an additional flattening process such as a CMP is necessary, whereby the cost further increases. Regarding this point, in the case of an organic material, there is an effect of flattening the first circuit substrate unit of the base, for example, by the spin coat of liquid or the like. Accordingly, a fine line can be formed without any additional flattening process, and the organic material is advantageous in terms of the cost.

In addition, here, while the manufacturing process in the form of a package in which the fine line circuit substrate unit including the dielectric layer using an organic material and including the conductor layer of fine lines is formed as the second circuit substrate unit including fine lines is formed on the LTCC package substrate unit using the LTCC material as the first circuit substrate unit has been described as an example, this similarly applies also to a case where the material of the package substrate, that is, the first circuit substrate unit is replaced with another material (for example, a core material-inserted organic package) or the like.

Fourth Embodiment

Figure 7:
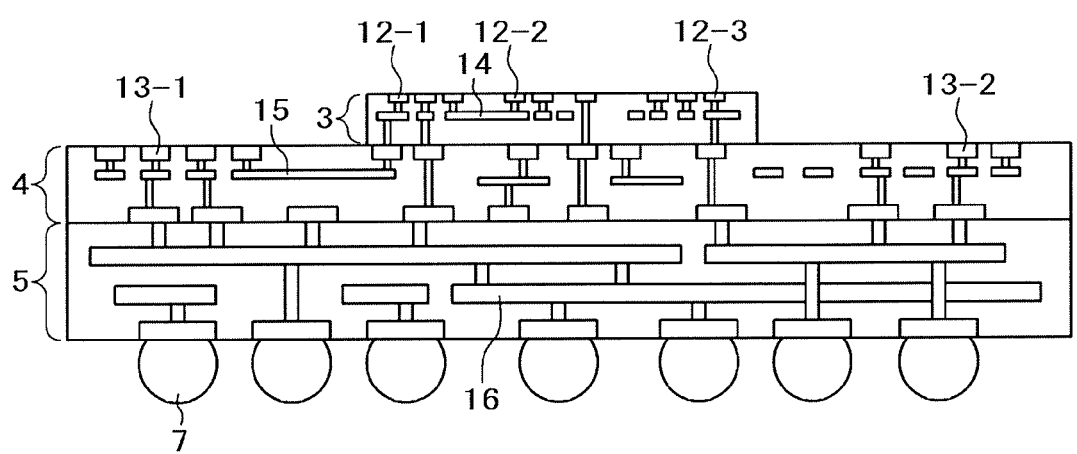
FIG. 7 is a cross-sectional view of a circuit substrate for a semiconductor package according to a fourth embodiment.

A cross-sectional view of a circuit substrate for a semiconductor package according to a fourth embodiment of the present invention is illustrated in FIG. 7, and a top view thereof is illustrated in FIG. 8.

In the configuration illustrated in FIG. 7, in a first circuit substrate unit 5 of a lowermost layer, a plurality of solder balls (BGA balls) 7 used for electrical connections with a mainboard are arranged on a lower face, and lines 16 used for electrically connecting the BGA balls and an LSI mounted in a semiconductor package are built on the inside of the first circuit substrate unit 5. Here, as the first circuit substrate unit, while an LTCC circuit substrate is assumed, a core material-inserted organic package may be used. In addition, the BGA balls may be configured by a land grid array (LGA).

On a face of the first circuit substrate unit 5 that faces a face on which the BGA balls 7 are arranged, a third circuit substrate unit 4 that is formed by stacking an organic thin-film dielectric material and a conductive material such as copper is formed. In this third circuit substrate unit 4, high-density lines 15 of which the minimum line width is ½ of that of the lines 16 of the first circuit substrate unit 5 or less are arranged.

In addition, on an upper face of the third circuit substrate unit 4, a second circuit substrate unit 3 of which the minimum line width is further smaller than that of the third circuit substrate unit 4 is formed. Furthermore, the area of the circuit formation face of the third circuit substrate unit 4 is equal to or less than that of the first circuit substrate unit 5, and the area of the circuit formation face of the second circuit substrate unit 3 is less than that of the third circuit substrate unit 4, which is also a structural characteristic (see FIGS. 7 and 8). There is a restriction on the shot size (an exposure area per one shot) in a stepper used when a fine line is formed as a conductive layer, and a large area cannot be exposed. However, by employing this configuration, a fine line portion requiring a stepper and a portion not requiring a stepper are divided so as to decrease the exposure area of the stepper, whereby a desirable effect of enabling the use of the stepper can be acquired.

In addition, semiconductor devices mounted on this circuit substrate for a semiconductor package may be mounted on the surface of the second circuit substrate unit 3 and both peripheral sides of the upper face of the third circuit substrate unit 4. In such a case, when connection terminal intervals of semiconductor device mounting electrodes 12-1 to 12-3 of the second circuit substrate unit and semiconductor device mounting electrodes 13-1 and 13-2 of the third circuit substrate unit are compared with each other, the minimal connection terminal interval of the second circuit substrate unit 3 is less than that of the third circuit substrate unit 4, which is also characteristic (see FIG. 8).

In Japanese Unexamined Patent Application Publication No. H03-190298, while a configuration in which the high-density line area is protruded as the hierarchy is employed, and changes in the line density occur only in two hierarchies of the protruded portion and a support portion disposed below the protruded portion, the hierarchical structure of the line density has three hierarchies or more in this embodiment. Also for the protruded structure, not only in the first step, but a stepped structure of two hierarchies or more of a case where the area of the third circuit substrate unit is smaller than that of the first circuit substrate unit may be configured, which is also characteristic.

In addition to the structural characteristic of this embodiment described above, differences in line widths and dielectric materials and advantages thereof will be described for the first to third circuit substrate unit. Table 2 illustrates relations among Young's modulus of the dielectric layer, the coefficient of thermal expansion (CTE), the material constant of the dielectric constant, the line width, the line area, and the use of each conductive layer.

TABLE 4

|  | First circuit substrate unit | Second circuit substrate unit | Third circuit substrate unit |
| --- | --- | --- | --- |
| Young's modulus [GPa] | about 100 | less than 10 (about 3) | less than 10 (about 3) |
| CTE [ppm/K] | about 3 to 10 | about 20 to 50 | about 20 to 50 |
| Dielectric constant | about 4 to 12 | about 3 to 5 | about 3 to 5 |
| Minimum line | about 15 to 30 μm | about 0.5 to 3 μm | about 5 to 10 μm |

TABLE 4-continued

|  | First circuit substrate unit | Second circuit substrate unit | Third circuit substrate unit |
|---|---|---|---|
| width |  |  |  |
| Line area | 50 mm square or more | about 30 mm square | 50 mm square or more |
| Use | mainboard connection line, structure support, matching coefficient of thermal expansion (improvement of fine pitch connectability) | broadband memory line | optical IC, high-speed line |

Figure 9:
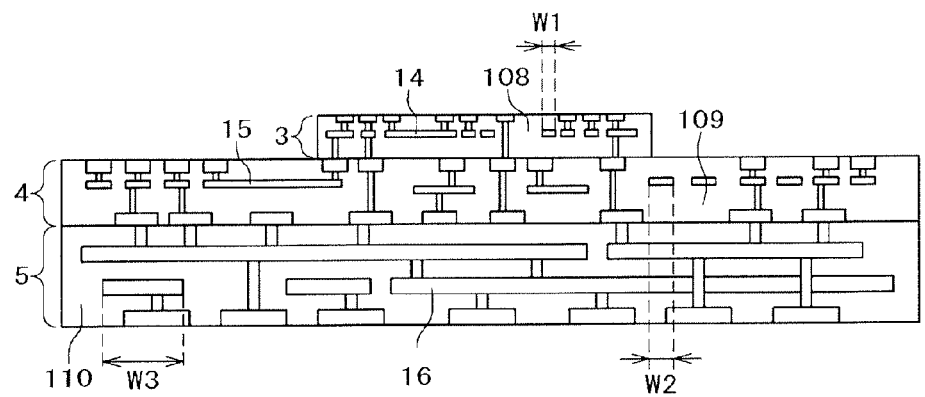
FIG. 9 is a comparative diagram of a first circuit substrate unit, a second circuit substrate unit, and a third circuit substrate unit according to the fourth embodiment.

The relations among the line widths of the conductive layer and the dielectric materials of the dielectric layer will be described with reference to FIG. 9.

The second circuit substrate unit 3 is assumed to be used dedicatedly for lines of a high-density memory such as an HBM, and the line width thereof is preferably less than 3 μm, and the lines are formed by a high-resolution exposure machine such as a stepper. In FIG. 9, a minimum line width denoted by W1 is less than 3 μm. In addition, in order to realize the formation of such a high-resolution pattern, a thin dielectric material having a thickness of about several μm is used for a peripheral insulator (denoted by reference numeral 108 in the figure). Generally, the Young's modulus of the thin dielectric material having the thickness of about several μm is low to be less than 10 GPa, and the strength is low. In addition, generally, the coefficient of thermal expansion is about 20 to 50 ppm/K, and the number of digits thereof is larger than 2.3 to 3 ppm/K of silicon of the semiconductor device by one. In addition, a material having a dielectric constant of about 3 to 5 is used. The line area is restricted by an exposure area of the stepper and has a size of which one longer side is 30 mm or less.

In addition, the third circuit substrate unit 4 is assumed to be used for lines for high-speed transmission such as an optical IC, and the line width thereof is preferably 10 μm or less. This area forms a line that is formed by a medium-resolution exposure machine such as a mask aligner. A minimum line width denoted by W2 in FIG. 9 is 10 μm or less. Also in the case of the formation of a pattern of such resolution, similar to the case of the second circuit substrate unit 3, a thin dielectric material having a thickness of about several μm is used for the peripheral insulator (reference numeral 109 in the figure). The Young's modulus and the coefficient of thermal expansion are the same as those described above. Since a high-speed signal of over 10 Gbps passes through the line of the conductive layer, in order to decrease a dielectric loss according to the dielectric layer approaching the conductive layer, the dielectric constant is preferably smaller (about 3) than that of the second circuit substrate unit 3 (not necessary). In addition, since the line area is not restricted by the exposure area (since a pattern of one longer side of 200 mm can be formed), an area of one longer side of 50 mm or more can be used.

By employing such a configuration, the second circuit substrate unit 3 and the third circuit substrate unit 4 are respectively used as a line dedicatedly used for a broadband memory and a line used for passing a high-speed signal such as an optical IC or the like in a separated manner. As a result, the number of lines of the conductive layer of the semiconductor package substrate can be configured to be minimal.

In addition, as described in the first embodiment, only the second circuit substrate unit 3 and the third circuit substrate unit 4 have low Young's modulus and thus have low strength levels, and accordingly, a package substrate of which the size of one longer side is about 50 mm cannot be configured. In addition, in order to connect a fine semiconductor device of which an inter-terminal distance is about several tens of μm to the upper part of the second circuit substrate unit 3, it is difficult to implement a connection on a large area due to a difference in the warpage according to a difference in the coefficient of thermal expansion from silicon, and only a connection face of which the size of one longer side is 10 mm or less can be formed. In order to solve such as problem, as the dielectric material of the first circuit substrate unit 5, a dielectric material having high Young's modulus and a small coefficient of thermal expansion is selected. As an example, numerical values of a case where LTCC is use are represented in Table 2. As a result, a package size of which the size of one longer side exceeds 50 mm is realized, and a connection area with a semiconductor device can be configured to have a size of which one longer side exceeds 20 mm per semiconductor device. In addition, the line width (denoted by reference sign W3 in the figure) of the first circuit substrate unit is larger than a width W2 and has a minimum value of about 15 to 30 μm.

According to this embodiment, the third circuit substrate unit including the conductive layer formed through a photolithographic process using a medium-resolution exposure machine (for example, a mask aligner) is inserted between the first circuit substrate unit and the second circuit substrate unit, and the line density is configured to be higher in order of the second circuit substrate unit, the third circuit substrate unit, and the first circuit substrate unit, whereby the line density of the package can be further improved.

According to such a circuit substrate for a semiconductor package, by employing a configuration in which a processor and an HBM are mounted on the second circuit substrate unit, and an optical IC and the like are mounted on the third circuit substrate unit, the processing capability can be markedly improved. In addition, a hierarchy having a different line density may be further disposed in the third circuit substrate unit.

Fifth Embodiment

Figure 10:
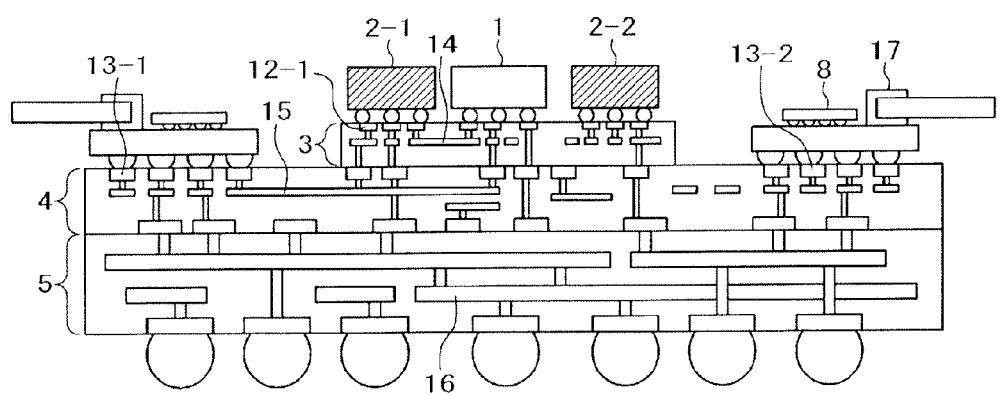
FIG. 10 is a cross-sectional view of a semiconductor package according to a fifth embodiment.

A cross-sectional view of a semiconductor package according to a fifth embodiment of the present invention is illustrated in FIG. 10, and a top view thereof is illustrated in FIG. 11. In the fifth embodiment, a semiconductor device is mounted on the circuit substrate for a semiconductor package according to the fourth embodiment. By mounting semiconductor devices according to such a configuration, the semiconductor devices can be interconnected with a line density higher than that of a general semiconductor package at a low loss, and accordingly, marked improvement of the transmission capacity can be acquired, and power required for the transmission can be decreased much.

As illustrated in the figure, on a second circuit substrate unit 3, devices 2-1 and 2-2 having high-density lines and an ASIC 1 are mounted, and, on a third circuit substrate unit 4, a signal line having high speed and a high density is mounted on the periphery of the second circuit substrate unit 3.

In addition, in the description presented here, while an example is illustrated in which the ASIC, a broadband memory having a high-density line such as an HBM, and a small optical module are mounted in the same package, any semiconductor device requiring a high-density line may be used instead of the HBM, and any device (for example, a stacked memory having a signal transmission function at speed exceeding 10 Gbps such as a signal conditioner, an LSI (used for the relay of an electrical signal), or a hybrid memory cube) that is desired to connect a high-speed signal of over 5 Gbps in a short distance for a high density and low power consumption may be used as the small optical module. Alternatively, the embodiment is not limited thereto, and a plurality of ASICs, CPUs, and FPGAs may be mixed.

Sixth Embodiment

Figure 12:
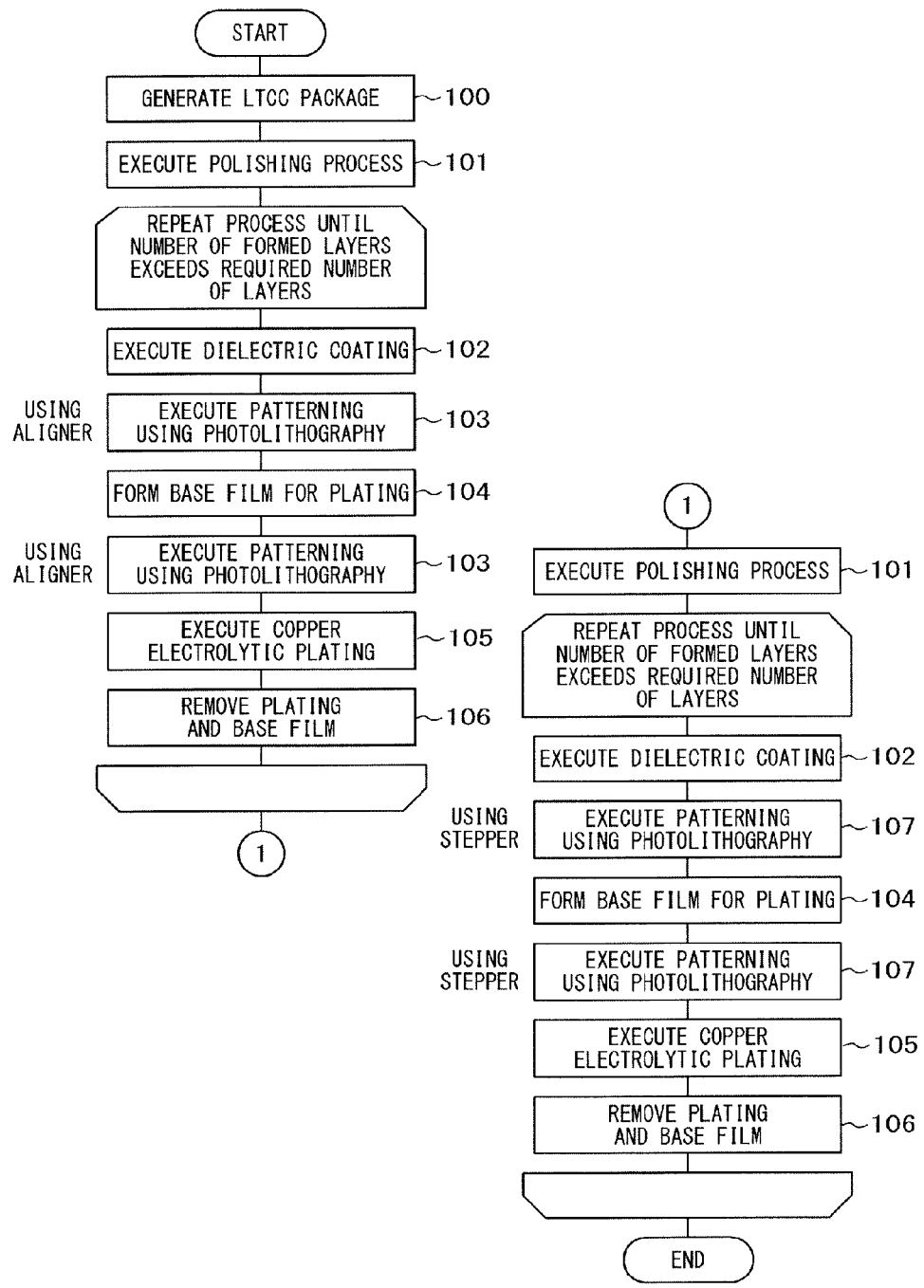
FIG. 12 is a flowchart of the process of manufacturing the circuit substrate for a semiconductor package according to the fourth embodiment as a sixth embodiment.

FIG. 12 illustrates the process of manufacturing the circuit substrate for a semiconductor package according to the fourth embodiment as a sixth embodiment.

First, an LTCC package substrate unit (first circuit substrate unit) is manufactured through the general LTCC package substrate unit manufacturing process 100. Thereafter, in order to form fine lines, a polishing process 101 is introduced for flattening unevenness or warpage generated in the LTCC package substrate unit manufacturing process 100. Next, in order to form a third circuit substrate unit, until the formation of a conductive layer is completed, a dielectric coating process 102, a patterning process 103 through photolithography by using a mask aligner, a base film forming process 104 for plating, the patterning process 103 through photolithography by using a mask aligner, a copper electrolytic plating process 105, and a plating and base film eliminating process 106 are repeated. In the dielectric coating process 102, in order to connect upper and lower lines 14, via holes may be disposed through a patterning process or the like. In addition, the patterning process 103 includes the process of coating, exposing, and developing a resist.

After the formation of this third circuit substrate unit is completed, the polishing process 101 is introduced again, and, after flatness that is sufficient for the formation of fine lines having a width of about 2 to 3 μm is formed on the surface, the following process for forming the second circuit substrate unit is executed. In other words, until the formation of a conductive layer is completed, a dielectric coating process 102, a patterning process 107 through photolithography by using a stepper, a base film forming process 104 for plating, the patterning process 107 through photolithography by using the stepper, a copper electrolytic plating process 105, and a plating and base film eliminating process 106 are repeated.

In addition, here, while a manufacturing process in the form of a package in which the fine line circuit substrate units as the second and third circuit substrate units are formed in two steps using the organic material on the LTCC package substrate unit as the first circuit substrate unit is described as an example, the process is similar also in a case where the package substrate is replaced with another material (for example, a core material-inserted organic package).

Seventh Embodiment

Figure 13:
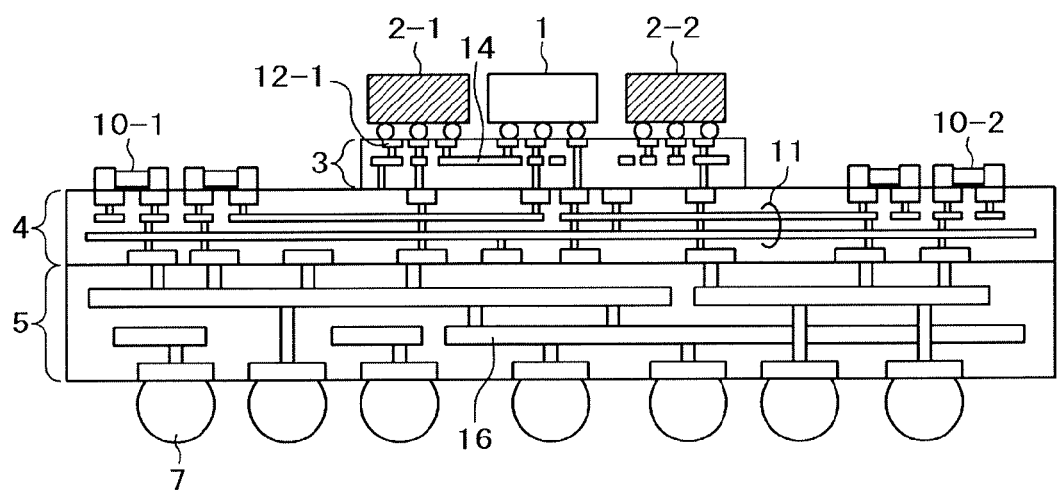
FIG. 13 is a cross-sectional view of a semiconductor package according to a seventh embodiment.

FIG. 13 illustrates an example in which a third circuit substrate unit is used for reducing power supply noises as a seventh embodiment.

On an upper face of the third circuit substrate unit 4, bypass capacitors 10-1 and 10-2 are mounted on the periphery of the second circuit substrate unit 3, and an LSI and the capacitors are connected through a power supply-ground plane 11 disposed inside the third circuit substrate unit 4.

For the high-frequency performance of the bypass capacitors used for reducing power supply noises, it is of significance to configure a path connecting the LSI and the capacitor to have low inductance. Accordingly, by employing the configuration of this embodiment, a short via connection and a connection using parallel flat plates having a short distance can be realized, and thus, an advantage of reducing high-frequency band noises can be expected. More specifically, generally, while a distance between the power supply and the ground plane of the LTCC package unit is about 50 μm, the power supply to the ground plane having an distance of about 1 to 2 μm can be formed in the third circuit substrate unit, and accordingly, the plane inductance can be expected to be reduced to be $\frac{1}{10}$ or less. In this configuration, while only the bypass capacitors are mounted on the third circuit substrate unit, an optical device and the like may be mixed therein as in the fifth embodiment.

What is claimed is:

1. A circuit substrate for a semiconductor package used for mounting a plurality of semiconductor devices, the circuit substrate comprising:
   a first circuit substrate unit that has a stacked structure of a dielectric layer and a conductor layer; and
   a second circuit substrate unit that is formed on the first circuit substrate unit and has a stacked structure of a dielectric layer and a conductor layer,
   wherein Young's modulus of a first dielectric material composing the dielectric layer of the first circuit substrate unit is higher than Young's modulus of a second dielectric material composing the dielectric layer of the second circuit substrate unit,
   a coefficient of thermal expansion of the first dielectric material composing the dielectric layer of the first circuit substrate unit is smaller than a coefficient of thermal expansion of the second dielectric material composing the dielectric layer of the second circuit substrate unit,
   the first circuit substrate unit has an area of a circuit formation larger than that of the second circuit substrate unit,
   a plurality of electrodes used for mounting a semiconductor device are included on a surface of the second circuit substrate unit, and
   a minimum line width of an electrical line embedded in the second circuit substrate unit is smaller than a minimum line width of an electrical line embedded in the first circuit substrate unit,
   wherein the second dielectric material composing the dielectric layer of the second circuit substrate unit is an organic material,
   wherein the first dielectric material composing the dielectric layer of the first circuit substrate unit is LTCC,
   a third circuit substrate unit that has an area of a circuit formation to be larger than that of the second circuit substrate unit and to be equal to or less than an area of the first circuit substrate unit between the first circuit substrate unit and the second circuit substrate unit and has a stacked structure of a dielectric layer and a conductor layer, wherein a minimum line width of the third circuit substrate unit is larger than the minimum line width of the second circuit substrate unit and is smaller than the minimum line width of the first circuit substrate unit, wherein one or more semiconductor devices are mounted on a surface of the second circuit substrate unit, and one or more semiconductor devices are mounted on an outer periphery of an upper face of the third circuit substrate unit.

2. The circuit substrate for a semiconductor package according to claim 1, wherein the Young's modulus and the coefficient of thermal expansion of the first dielectric material composing the dielectric layer of the first circuit substrate unit are respectively 80 to 200 GPa and 3 to 10 ppm/K, and the Young's modulus and the coefficient of thermal expansion of the second dielectric material composing the dielectric layer of the second circuit substrate unit are respectively less than 10 GPa and 20 to 50 ppm/K.

3. The circuit substrate for a semiconductor package according to claim 1, wherein the Young's modulus and the coefficient of thermal expansion of the first dielectric material composing the dielectric layer of the first circuit substrate unit are respectively 80 to 200 GPa and 3 to 10 ppm/K, the Young's modulus and the coefficient of thermal expansion of the second dielectric material composing the dielectric layer of the second circuit substrate unit are respectively less than 10 GPa and 20 to 50 ppm/K, and Young's modulus and a coefficient of thermal expansion of a third dielectric material composing the dielectric layer of the third circuit substrate unit are respectively less than 10 GPa and 20 to 50 ppm/K.

4. The circuit substrate for a semiconductor package according to claim 1, wherein the third dielectric material composing the dielectric layer of the third circuit substrate unit is an organic material.

5. A semiconductor package comprising the circuit substrate for a semiconductor package according to claim 1, wherein one or more semiconductor devices are mounted on a surface of the second circuit substrate unit, and one or more bypass capacitors are mounted on an outer periphery of an upper face of the third circuit substrate unit.

6. A semiconductor package comprising the circuit substrate for a semiconductor package according to claim 1, wherein one or more semiconductor devices are mounted on a surface of the second circuit substrate unit.

7. A semiconductor package comprising the circuit substrate for a semiconductor package according to claim 1, wherein a minimum line width of an electrical line embedded in the second circuit substrate unit is 3 µm or less.

8. The semiconductor package comprising the circuit substrate for a semiconductor package according to claim 1, wherein the second dielectric material composing the dielectric layer of the second circuit substrate unit is a cycloolefin polymer organic material.

9. The semiconductor package comprising the circuit substrate for a semiconductor package according to claim 6, wherein said one or more semiconductor devices comprise a Central Processing Unit (CPU), a memory, an Application Specific Integrated Circuit (ASIC), or an optical integrated circuit (IC).

10. A circuit substrate for a semiconductor package used for mounting a plurality of semiconductor devices, the circuit substrate comprising:

a first circuit substrate unit that has a stacked structure of a dielectric layer and a conductor layer; and a second circuit substrate unit that is formed on the first circuit substrate unit and has a stacked structure of a dielectric layer and a conductor layer, wherein Young's modulus of a first dielectric material composing the dielectric layer of the first circuit substrate unit is higher than Young's modulus of a second dielectric material composing the dielectric layer of the second circuit substrate unit, a coefficient of thermal expansion of the first dielectric material composing the dielectric layer of the first circuit substrate unit is smaller than a coefficient of thermal expansion of the second dielectric material composing the dielectric layer of the second circuit substrate unit, the first circuit substrate unit has an area of a circuit formation larger than that of the second circuit substrate unit, a plurality of electrodes used for mounting a semiconductor device are included on a surface of the second circuit substrate unit, and a minimum line width of an electrical line embedded in the second circuit substrate unit is smaller than a minimum line width of an electrical line embedded in the first circuit substrate unit, wherein the second dielectric material composing the dielectric layer of the second circuit substrate unit is an organic material, wherein the first dielectric material composing the dielectric layer of the first circuit substrate unit is LTCC, and wherein a minimum line width of an electrical line embedded in the second circuit substrate unit is 3 µm or less, a third circuit substrate unit that has an area of a circuit formation to be larger than that of the second circuit substrate unit and to be equal to or less than an area of the first circuit substrate unit between the first circuit substrate unit and the second circuit substrate unit and has a stacked structure of a dielectric layer and a conductor layer, wherein a minimum line width of the third circuit substrate unit is larger than the minimum line width of the second circuit substrate unit and is smaller than the minimum line width of the first circuit substrate unit, wherein one or more semiconductor devices are mounted on a surface of the second circuit substrate unit, and one or more semiconductor devices are mounted on an outer periphery of an upper face of the third circuit substrate unit.

11. The circuit substrate for a semiconductor package according to claim 10, wherein the Young's modulus and the coefficient of thermal expansion of the first dielectric material composing the dielectric layer of the first circuit substrate unit are respectively 80 to 200 GPa and 3 to 10 ppm/K, and the Young's modulus and the coefficient of thermal expansion of the second dielectric material composing the dielectric layer of the second circuit substrate unit are respectively less than 10 GPa and 20 to 50 ppm/K.

12. The circuit substrate for a semiconductor package according to claim 10, wherein the Young's modulus and the coefficient of thermal expansion of the first dielectric material composing the dielectric layer of the first circuit substrate unit are respectively 80 to 200 GPa and 3 to 10 ppm/K, the Young's modulus and the coefficient of thermal expansion of the second dielectric material composing the dielectric layer of the second circuit substrate unit are respectively less than 10 GPa and 20 to 50 ppm/K, and Young's modulus and a coefficient of thermal expansion of a third dielectric material composing the dielectric layer of the third circuit substrate unit are respectively less than 10 GPa and 20 to 50 ppm/K.

13. The circuit substrate for a semiconductor package according to claim 10, wherein the third dielectric material composing the dielectric layer of the third circuit substrate unit is an organic material.

14. The semiconductor package comprising the circuit substrate for a semiconductor package according to claim 10,
wherein one or more semiconductor devices are mounted on a surface of the second circuit substrate unit, and
one or more bypass capacitors are mounted on an outer periphery of an upper face of the third circuit substrate unit.

15. The semiconductor package comprising the circuit substrate for a semiconductor package according to claim 10, wherein one or more semiconductor devices are mounted on a surface of the second circuit substrate unit.

16. The semiconductor package comprising the circuit substrate for a semiconductor package according to claim 10,
wherein the second dielectric material composing the dielectric layer of the second circuit substrate unit is a cycloolefin polymer organic material.

17. The semiconductor package comprising the circuit substrate for a semiconductor package according to claim 15, wherein said one or more semiconductor devices comprise a Central Processing Unit (CPU), a memory, an Application Specific Integrated Circuit (ASIC), or an optical integrated circuit (IC).

* * * * *